US007682973B2

(12) United States Patent
Kim et al.

(10) Patent No.: US 7,682,973 B2
(45) Date of Patent: Mar. 23, 2010

(54) METHOD OF FORMING A CARBON NANOTUBE STRUCTURE AND METHOD OF MANUFACTURING FIELD EMISSION DEVICE USING THE METHOD OF FORMING A CARBON NANOTUBE STRUCTURE

(75) Inventors: Ha-Jin Kim, Yongin-si (KR); In-Taek Han, Yongin-si (KR); Young-Chul Choi, Yongin-si (KR); Kwang-Seok Jeong, Yongin-si (KR)

(73) Assignee: Samsung SDI Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 390 days.

(21) Appl. No.: 11/656,370

(22) Filed: Jan. 23, 2007

(65) Prior Publication Data

US 2008/0003733 A1 Jan. 3, 2008

(30) Foreign Application Priority Data

Jun. 30, 2006 (KR) ..................... 10-2006-0060663

(51) Int. Cl.
*H01L 21/44* (2006.01)

(52) U.S. Cl. ....................... 438/680; 438/689; 438/775; 438/776; 438/777; 977/742; 977/842; 977/938; 977/939

(58) Field of Classification Search ................ 438/680, 438/689, 775–777; 977/742, 842, 938, 939
See application file for complete search history.

(56) References Cited

U.S. PATENT DOCUMENTS

| | | | | |
|---|---|---|---|---|
| 6,514,113 | B1 * | 2/2003 | Lee et al. | 445/50 |
| 7,094,692 | B2 * | 8/2006 | Horibe et al. | 438/680 |
| 2006/0238096 | A1 * | 10/2006 | Han et al. | 313/311 |
| 2006/0252251 | A1 * | 11/2006 | Park et al. | 438/618 |
| 2007/0007872 | A1 * | 1/2007 | Park et al. | 313/346 R |

* cited by examiner

*Primary Examiner*—Andy Huynh
(74) *Attorney, Agent, or Firm*—Robert E. Bushnell, Esq.

(57) ABSTRACT

A method of forming a Carbon NanoTube (CNT) structure and a method of manufacturing a Field Emission Device (FED) using the method of forming a CNT structure includes: forming an electrode on a substrate, forming a buffer layer on the electrode, forming a catalyst layer in a particle shape on the buffer layer, etching the buffer layer exposed through the catalyst layer, and growing CNTs from the catalyst layer formed on the etched buffer layer.

25 Claims, 6 Drawing Sheets

METHOD OF FORMING A CARBON NANOTUBE STRUCTURE AND METHOD OF MANUFACTURING FIELD EMISSION DEVICE USING THE METHOD OF FORMING A CARBON NANOTUBE STRUCTURE

CLAIM OF PRIORITY

This application makes reference to, incorporates the same herein, and claims all benefits accruing under 35 U.S.C. §119 from an application for METHOD OF FORMING CARBON NANOTUBE STRUCTURE AND METHOD OF MANUFACTURING FIELD EMISSION DEVICE USING THE SAME earlier filed in the Korean Intellectual Property Office on the 30$^{th}$ day of Jun. 2006 and there duly assigned Serial No. 10-2006-0060663.

BACKGROUND OF THE INVENTION

1. Field of the Invention

The present invention relates to a method of forming a carbon nanotube structure and a method of manufacturing a field emission device using the method of forming a carbon nanotube structure, and more particularly, the present invention relates to a method of forming a high quality carbon nanotube structure at a low temperature and a method of manufacturing a field emission device using the method of forming a carbon nanotube structure.

2. Description of the Related Art

A Field Emission Device (FED) emits visible light due to the collision of electrons emitted from emitters formed on a cathode electrode with a phosphor layer formed on an anode electrode. The FED can be applied to a FED back light unit of FEDs that form images using field emissions or a field emission backlight unit of Liquid Crystal Displays (LCDs).

In the FED, a micro tip formed of a metal, such as Mo, is used as a conventional emitter of electrons. However, recently, carbon nanotubes (CNTs) have been mainly used as emitters. FEDs that use CNTs as emitters have a high possibility of being applied to various fields such as a car navigation apparatus or a view finder for electronic image displays due to a wide viewing angle, high resolution, low power consumption, and temperature stability of the FEDs. In particular, the FEDs that use CNTs as emitters can replace a display apparatus in personal computers, Personal Data Assistants (PDAs), medical instruments, or High Definition TeleVisions (HDTVs).

In manufacturing FEDs using CNTs, the obstacles that are faced are an increase in lifetime, manufacturing a large screen, reducing costs, and reducing an operating voltage.

In order to increase the lifetime of the FED, CNTs can be synthesized using a Chemical Vapor Deposition (CVD) method. In this method, the degradation of the CNTs can be prevented by growing the CNTs directly on a substrate without using an organic binder, thus increasing the lifetime of the FED. But, this method has drawbacks in that an adhesion force between the CNTs and the substrate is weak since an organic binder is not used and the activity of a catalyst layer for growing the CNTs is reduced since the catalyst layer reacts with the substrate.

The manufacture of a large screen and reduction in cost of the FEDs can be achieved by using an inexpensive sodalime glass substrate. However, the sodalime glass substrate has a relatively low deformation temperature of approximately 480° C. In other words, the synthesis of the CNTs on the sodalime substrate using a CVD method must be performed at a temperature lower than 480° C. However, it is technically very difficult to do so. That is, in order to synthesize the CNTs at a low temperature, reaction gases must decompose at a temperature lower than 480° C., and must meet a complicated reaction condition whereby the decomposed gases must be precipitated by diffusing into a catalyst layer.

In order to reduce an operating voltage of the FEDs, it is necessary to control the density of the synthesized CNTs. One of the reasons why the CNTs are used as emitters in the FEDs is that the CNTs have a high field enhancement effect due to a large aspect ratio of each of the CNTs. However, if the density of the CNTs is too high, the aspect ratio of a CNT bundle is much less than each of the CNTs. In such a case, a high operating voltage is required in order to emit electrons. To solve this problem, the density control of the CNTs is important.

During a synthesizing process of the CNTs, a catalyst layer must be present as particles so that carbon atoms that are diffused into the catalyst layer can be precipitated in a tube shape. However, the catalyst layer has a tendency of agglomerating at a synthesizing temperature of the CNTs. Therefore, there is a need to prevent the catalyst layer from agglomerating during the synthesizing process.

SUMMARY OF THE INVENTION

The present invention provides a method of forming a carbon nanotube (CNT) structure that can realize a long lifetime, be used for a large screen, has low manufacturing costs, and operates at a low operating voltage by synthesizing high quality CNTs at a low temperature and a method of manufacturing a Field Emission Device (FED) using the CNT structure.

According to one aspect of the present invention, a method of forming a Carbon NanoTube (CNT) structure is provided, the method including: forming an electrode on a substrate; forming a buffer layer on the electrode; forming a catalyst layer in a particle shape on the buffer layer; etching the buffer layer exposed through the catalyst layer; and growing CNTs from the catalyst layer formed on the etched buffer layer.

The buffer layer is preferably formed of a material having an etch selectivity with respect to the catalyst layer. The buffer layer is preferably formed of at least one metal selected from a group consisting of Al, B, Ga, In, Tl, Ti, Mo, and Cr. The buffer layer is preferably formed to a thickness in a range of 10 to 3000 Å.

The catalyst layer is preferably formed of at least one metal selected from a group consisting of Fe, Co, and Ni. The catalyst layer is preferably formed to a thickness in a range of 2 to 100 Å.

The etching of the buffer layer is preferably continued until the cathode electrode is exposed.

The electrode is preferably formed of at least one metal selected from a group consisting of Mo and Cr.

The CNTs are grown by a Chemical Vapor Deposition (CVD) method.

The method preferably further includes forming a resistance layer on either an upper or a lower surface of the electrode. The resistance layer is preferably formed of amorphous silicon.

According to another aspect of the present invention, a method of manufacturing a Field Emission Device (FED) is provided, the method including: sequentially forming a cathode electrode, an insulating layer, and a gate electrode on a substrate; patterning the gate electrode and forming an emitter hole to expose the cathode electrode by etching the insulating layer exposed through the patterned gate electrode; forming a buffer layer on the cathode electrode formed in the emitter hole; forming a catalyst layer in a particle shape on the buffer layer; etching the buffer layer exposed through the catalyst layer; and growing Carbon NanoTubes (CNTs) from the catalyst layer formed on the etched buffer layer.

The buffer layer is preferably formed of a material having an etch selectivity with respect to the catalyst layer. The buffer layer is preferably formed of at least one metal selected from a group consisting of Al, B, Ga, In, Tl, Ti, Mo, and Cr. The buffer layer is preferably formed to a thickness in a range of 10 to 3000 Å.

The catalyst layer is preferably formed of at least one metal selected from a group consisting of Fe, Co, and Ni. The catalyst layer is preferably formed to a thickness in a range of 2 to 100 Å.

The cathode electrode is preferably formed of at least one metal selected from a group consisting of Mo and Cr.

Forming the emitter hole preferably includes: forming a photoresist on the patterned gate electrode; and etching the insulating layer exposed through the photoresist and the gate electrode until the cathode electrode is exposed.

Forming the buffer layer and the catalyst layer preferably includes: forming the buffer layer on the photoresist and the cathode electrode in the emitter hole; and forming the particle shaped catalyst layer on the buffer layer.

The method preferably further includes removing the photoresist and the buffer layer and catalyst layer formed on the photoresist after the buffer layer exposed through the catalyst layer has been etched.

The etching of the buffer layer is preferably continued until the cathode electrode is exposed.

The CNTs are preferably grown using a Chemical Vapor Deposition (CVD) method.

The method preferably further includes forming a resistance layer on either an upper or a lower surface of the cathode electrode. The resistance layer is preferably formed of amorphous silicon.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
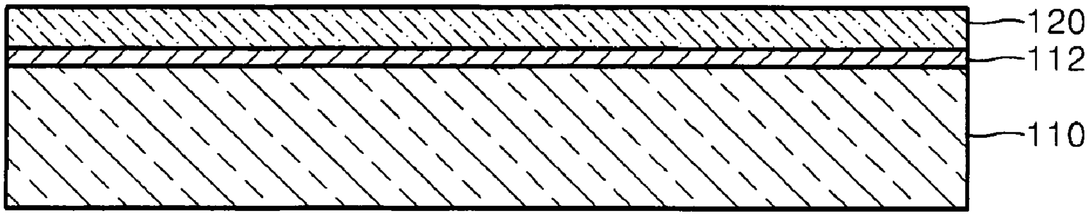
FIGS. 1 through 4 are cross-sectional views of a method of forming a carbon nanotube (CNT) structure according to an embodiment of the present invention.

The present invention is described more fully below with reference to the accompanying drawings in which exemplary embodiments of the present invention are shown. In the drawings, like reference numerals refer to like elements throughout the drawings, and the thicknesses of layers and regions have been exaggerated for clarity.

FIGS. 1 through 4 are cross-sectional views of a method of forming a carbon nanotube (CNT) structure according to an embodiment of the present invention.

Referring to FIG. 1, an electrode 112 is deposited on a substrate 110. The substrate 110 can be a glass substrate or a silicon wafer. The electrode 112 can be formed, for example, by depositing at least one of a predetermined metal of Mo and Cr. Although it is not shown, a process of forming a resistance layer on an upper or a lower surface of the electrode 112 can further be included. The resistance layer is formed to induce uniform electron emission from CNTs 150 (refer to FIG. 4), and can be formed of amorphous silicon.

Next, a buffer layer 120 having a predetermined thickness is formed on the electrode 112. The buffer layer 120 has a high adhesiveness with respect to a catalyst layer 130 (refer to FIG. 2) formed on the buffer layer 120 and has a low reactivity with respect to the substrate 110 or the electrode 112 formed therebelow. The buffer layer 120 may be formed of a material having high adhesiveness with the substrate 110 or the electrode 112 and an etch selectivity with respect to the catalyst layer 130. The buffer layer 120 can be formed of an amphoteric metal, such as Al, B, Ga, In, or Tl, and also, a metal, such as Ti, Mo, or Cr if the buffer layer 120 has an etch selectivity with respect to the catalyst layer 130. The metals mentioned above can be used as pure metals or an alloy of two or more of these metals. The buffer layer 120 can be formed to a thickness of 10 to 3000 Å.

Figure 2:
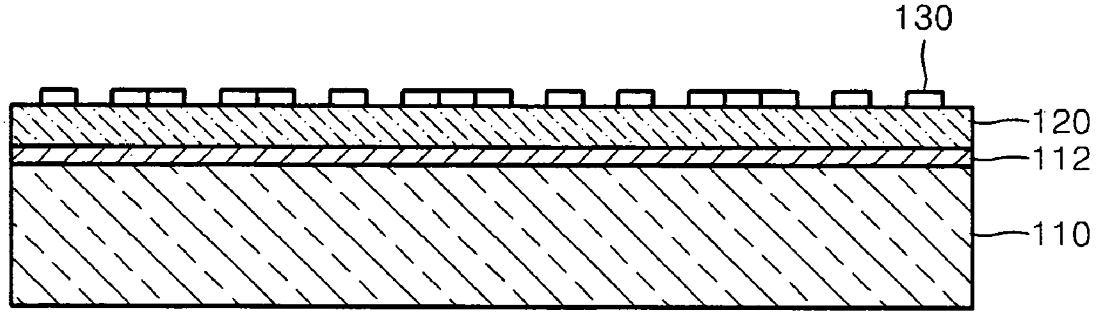

Referring to FIG. 2, the catalyst layer 130 in a particle shape is formed on an upper surface of the buffer layer 120. The catalyst layer 130 can be formed by depositing a catalyst metal in a thin film shape on the upper surface of the buffer layer 120. When the catalyst layer 130 is deposited to a thickness of 2 to 100 Å, the catalyst layer 130 can be formed in a discontinuous particle shape. The catalyst layer 130 can be formed of a transition metal, such as Fe, Ni, Co in a pure state or an alloy of two or more of these metals.

Figure 3:
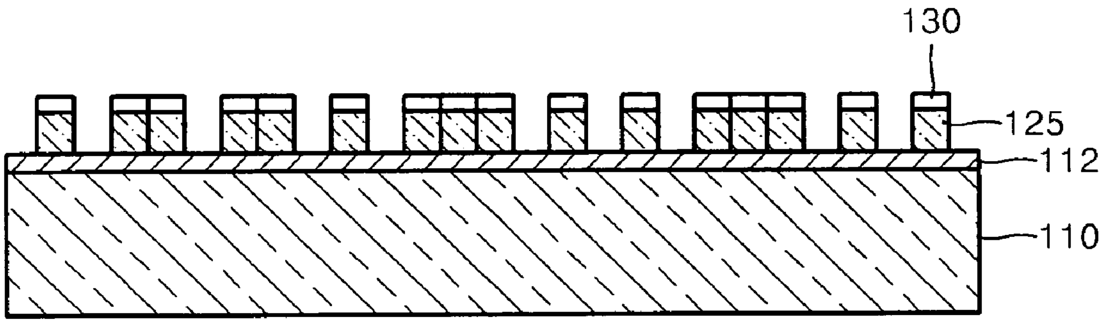

Referring to FIG. 3, the buffer layer 120 that is exposed through the particle shaped catalyst layer 130 is etched to a predetermined depth. More specifically, when the structure depicted in FIG. 2 is soaked in an etching solution that can only selectively etch the buffer layer 120, but does not etch the catalyst layer 130 for a predetermined time, the buffer layer 120 located under the particle shaped catalyst layer 130 remains unetched, but the buffer layer 120 exposed through the catalyst layer 130 is selectively etched to a predetermined depth. The etching of the buffer layer 120 can be continued until the electrode 112 is exposed. In this way, when the buffer layer 120 is selectively etched through the particle shaped catalyst layer 130 at room temperature, the agglomeration of the catalyst layer 130 in a process of growing CNTs 150 (refer to FIG. 4) can be prevented.

Figure 4:
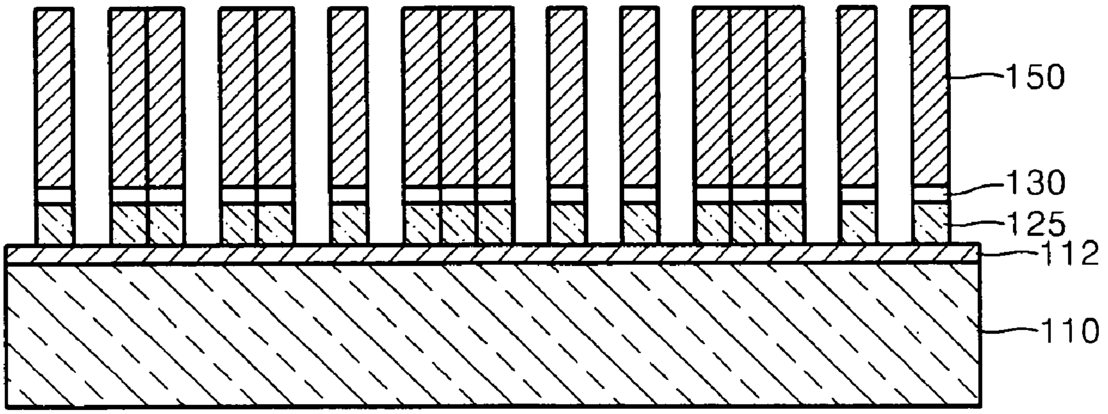
Figure 5:
FIG. 5 is a Scanning Electron Microscope (SEM) image of CNTs grown using the method of forming CNTs according to an embodiment of the present invention.

Referring to FIG. 4, the CNTs 150 are grown from the catalyst layer 130 formed on the selectively etched buffer layer 120. The CNTs 150 can be grown by a Chemical Vapor Deposition (CVD) method. The CNTs 150 can be grown, for example, at a low temperature lower than 480° C. FIG. 5 is a Scanning Electron Microscope (SEM) image of CNTs grown using the above method, according to an embodiment of the present invention.

As described above, according to an embodiment of the present invention, the particle shaped catalyst layer 130 is prevented from being agglomerated even if the CNTs 150 are grown from the catalyst layer 130 at a low temperature by selectively etching the buffer layer 120 exposed through the particle shaped catalyst layer 130. Accordingly, high quality CNTs 150 can be obtained at a low temperature. Also, the density of the grown CNTs 150 can be controlled by controlling the thickness and etching process time of the buffer layer 120.

Hereinafter, a method of manufacturing a Field Emission Device (FED) using the method of forming a CNT structure as described above is described. The FED manufactured according to the following method can be applied to not only to FEDs that display images using field emissions, but also to a field emission back light unit of LCDs.

FIGS. 6 through 11 are cross-sectional views of a method of manufacturing a FED according to another embodiment of the present invention.

Figure 6:
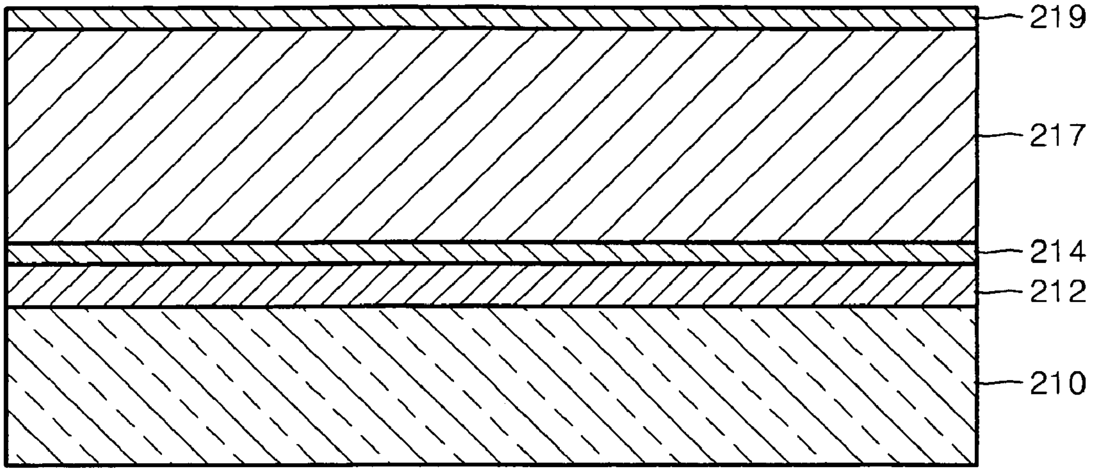
FIGS. 6 through 11 are cross-sectional views of a method of manufacturing a Field Emission Device (FED) according to another embodiment of the present invention.

Referring to FIG. 6, a cathode electrode 212, a resistance layer 214, an insulating layer 217, and a gate electrode 219 are sequentially formed on a substrate 210. The substrate 210 can be a glass substrate or a silicon wafer. The cathode electrode 212 can be formed by depositing at least a metal of Mo and Cr on an upper surface of the substrate 210 and patterning the deposited metal in a predetermined shape, for example, a stripe shape.

The resistance layer 214 can further be formed on an upper surface of the cathode electrode 212. The resistance layer 214 is formed to induce uniform electron emission from an emitter 300 (refer to FIG. 11) by applying a uniform current to CNTs 250 of the emitter 300 as will be described later. The resistance layer 214 can be formed of amorphous silicon. In FIG. 6, the resistance layer 214 is formed on the upper surface of the cathode electrode 212, but the resistance layer 214 can be formed on a lower surface of the cathode electrode 212 or the resistance layer 214 may not be formed.

Hereinafter, the case when the resistance layer 214 is formed on the upper surface of the cathode electrode 212 is described. After the insulating layer 217, which is covering the cathode electrode 212 and the resistance layer 214, is formed, the gate electrode 219 is deposited on an upper surface of the insulating layer 217. The gate electrode 219 can be formed by depositing a conductive metal, such as Cr, on the upper surface of the insulating layer 217.

Figure 7:
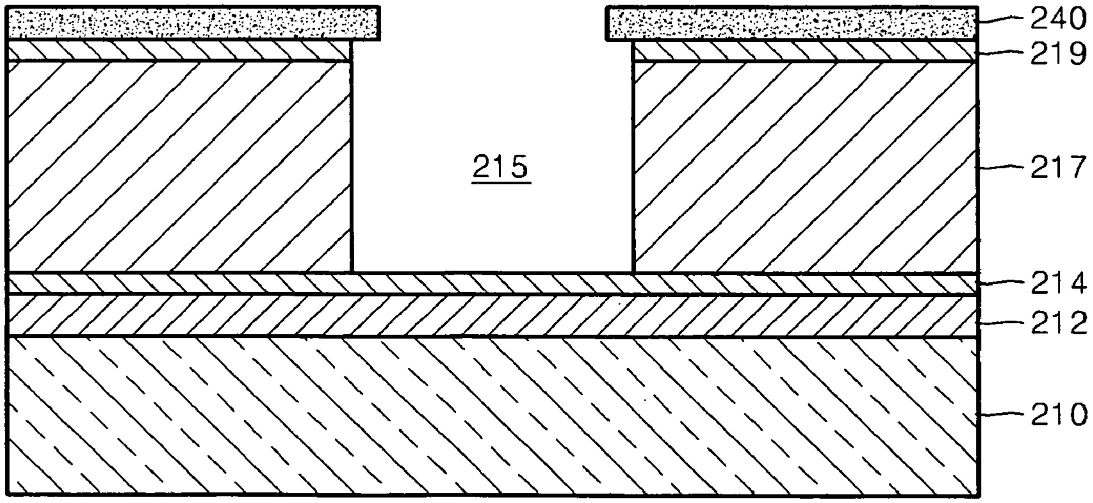

Referring to FIG. 7, after the gate electrode 219 is patterned, a photoresist 240 is formed on an upper surface of the patterned gate electrode 219. An emitter hole 215 is formed in the insulating layer 217 by etching the insulating layer 217 exposed through the photoresist 240 and the gate electrode 219. The etching of the insulating layer 217 is continued until the resistance layer 214 is exposed. Accordingly, the upper surface of the resistance layer 214 is exposed through the emitter hole 215. When the resistance layer 214 is not formed or the resistance layer 214 is formed on a lower surface of the cathode electrode 212, the upper surface of the cathode electrode 212 is exposed through the emitter hole 215.

Figure 8:
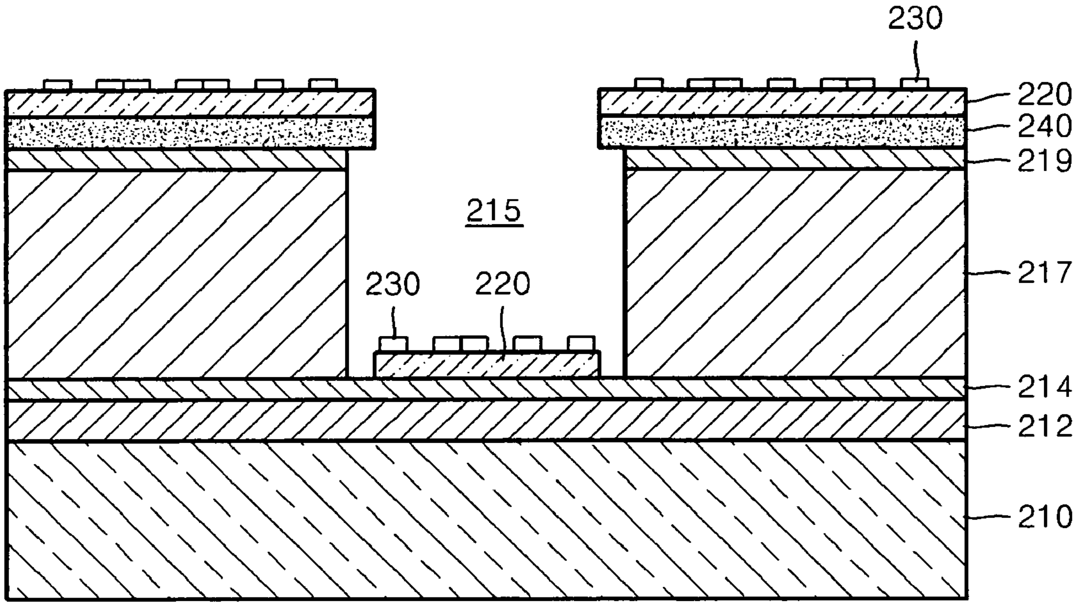

Referring to FIG. 8, a buffer layer 220 is formed to a predetermined thickness on the upper surface of the resistance layer 214 exposed through the emitter hole 215 and an upper surface of the photoresist 240. The buffer layer 220 has a high adhesiveness with respect to a catalyst layer 230 in a particle shape formed on the buffer layer 220 and has a low reactivity with respect to the cathode electrode 212 or the resistance layer 214 formed below the catalyst layer 230. Preferably, the buffer layer 220 may be formed of a material having high adhesiveness with respect to the cathode electrode 212 or the resistance layer 214 and has an etch selectivity with respect to the catalyst layer 230 formed on the buffer layer 220. The buffer layer 220 can be formed of an amphoteric metal, such as Al, B, Ga, In, or Tl, and also, a metal, such as Ti, Mo, or Cr, if Ti, Mo, or Cr that has an etch selectivity with respect to the catalyst layer 230. The metals can be used as pure metals or as alloys of two or more of these metals. The buffer layer 220 can be formed to a thickness of 10 to 3000 Å.

Next, the particle shaped catalyst layer 230 is formed on an upper surface of the buffer layer 220. The catalyst layer 230 can be formed by depositing a catalyst metal on an upper surface of the buffer layer 220 in a thin film shape. When the catalyst layer 230 is formed to a thickness of 2 to 100 Å, the catalyst layer 230 is formed in a discontinuous particle shape. The catalyst layer 230 can be formed of a transition metal, such as Fe, Ni, or Co, in a pure metal state or an alloy of two or more of these metals.

Figure 9:
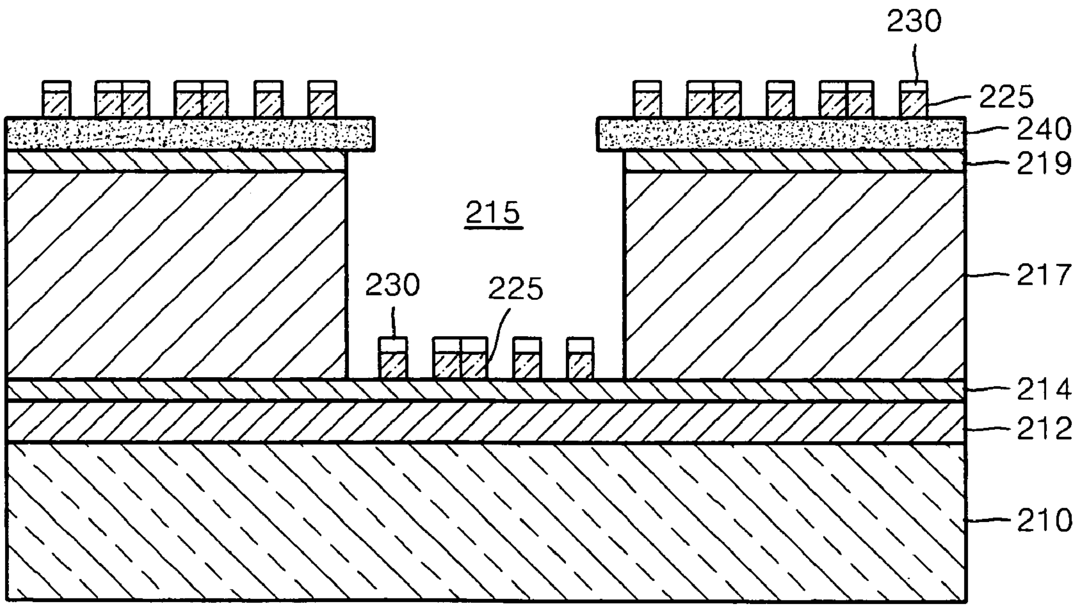
Figure 10:
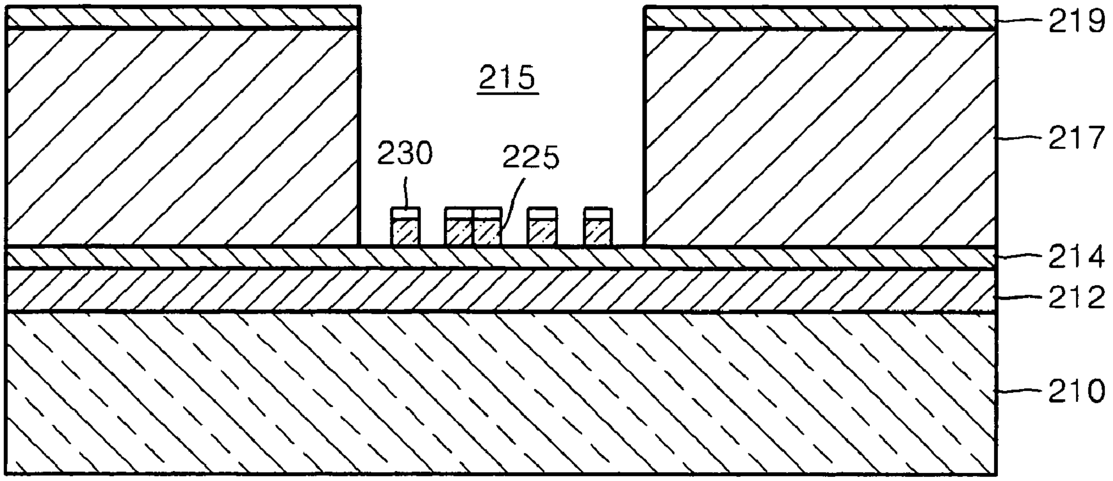

Referring to FIG. 9, the buffer layer 220 that is exposed through the catalyst layer 230 is etched to a predetermined depth. More specifically, when the structure depicted in FIG. 8 is soaked in an etching solution that can selectively etch only the buffer layer 220, but does not etch the catalyst layer 230 for a predetermined time, a buffer layer 225 located under the particle shaped catalyst layer 230 remains unetched, but the buffer layer 220 exposed through the catalyst layer 230 is selectively etched to a predetermined depth. The etching of the buffer layer 220 can be continued until the resistance layer 214 is exposed. When the resistance layer 214 is not formed or the resistance layer 214 is formed on a lower surface of the cathode electrode 212, the etching of the buffer layer 220 can be continued until the cathode electrode 212 is exposed.

In this way, when the buffer layer 220 is selectively etched through the particle shaped catalyst layer 230 at room temperature, the agglomeration of the particle shaped catalyst layer 230 can be prevented in a process of growing CNTs 250 (refer to FIG. 11) as will be described later. Next, referring to FIG. 10, the photoresist 240, and the buffer layer 220 and the catalyst layer 230 stacked on the photoresist 240 are removed by, for example, a lift-off method.

Figure 11:
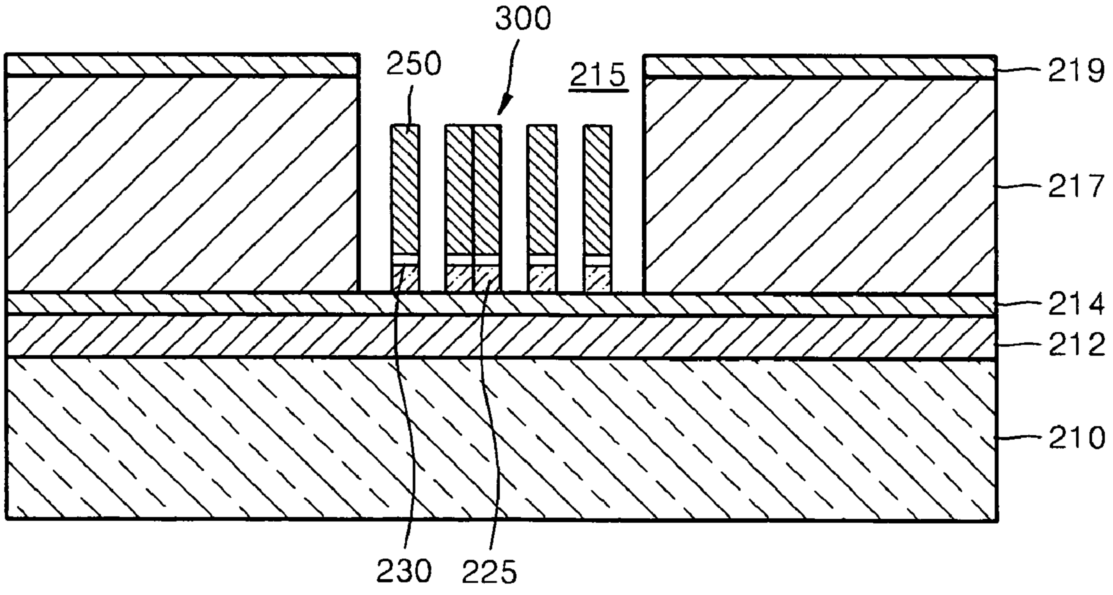

Referring to FIG. 11, emitters of electrons are formed in the emitter hole 215 when the CNTs 250 are grown from the catalyst layer 230 formed on the etched buffer layer 225. The CNTs 250 can be formed by a CVD method. The CNTs 250 can be formed at a low temperature, for example, lower than 480° C. The density of the CNTs 250 that are grown in this process can be controlled by controlling the thickness and etching time of the buffer layer 220.

As described above, according to the present invention, the formation of a fine particle shaped catalyst layer and the prevention of agglomerating the catalyst layer can be realized at a low temperature, which were realized at a high temperature in the prior art, by forming a buffer layer formed of a material having an etch selectivity with respect to the catalyst layer on a lower surface of a particle shaped catalyst layer and selectively etching the buffer layer exposed through the catalyst layer. Therefore, high quality CNTs can be synthesized at a low temperature.

While the present invention has been particularly shown and described with reference to exemplary embodiments thereof, it will be understood by those of ordinary skill in the art that various modifications in form and detail may be made therein without departing from the spirit and scope of the present invention as defined by the following claims.

What is claimed is:

1. A method of forming a Carbon Nanolube (CNT) structure, the method comprising:

forming an electrode on a substrate;

forming a buffer layer on the electrode;

forming a catalyst layer in a particle shape on the buffer layer;

etching the buffer layer exposed through the catalyst layer; and growing CNTs from the catalyst layer formed on the etched buffer layer.

2. The method of claim 1, wherein the buffer layer is formed of a material having an etch selectivity with respect to the catalyst layer.

3. The method of claim 2, wherein the buffer layer is formed of at least one metal selected from a group consisting of Al, B, Ga, In, Tl, Ti, Mo, and Cr.

4. The method of claim 2, wherein the buffer layer is formed to a thickness in a range of 10 to 3000 Å.

5. The method of claim 2, wherein the catalyst layer is formed of at least one metal selected from a group consisting of Fe, Co, and Ni.

6. The method of claim 1, wherein the catalyst layer is formed to a thickness in a range of 2 to 100 Å.

7. The method of claim 1, wherein the etching of the buffer layer is continued until the electrode is exposed.

8. The method of claim 1, wherein the electrode is formed of at least one metal selected from a group consisting of Mo and Cr.

9. The method of claim 1, wherein the CNTs are grown by a Chemical Vapor Deposition (CYD) method.

10. The method of claim 1, further comprising forming a resistance layer on either an upper or a lower surface of the electrode.

11. The method of claim 10, wherein the resistance layer is formed of amorphous silicon.

12. A method of manufacturing a Field Emission Device (FED), the method comprising:

sequentially forming a cathode electrode, an insulating layer, and a gate electrode on a substrate;

patterning the gate electrode and forming an emitter hole to expose the cathode electrode by etching the insulating layer exposed through the patterned gate electrode;

forming a buffer layer on the cathode electrode formed in the emitter hole;

forming a catalyst layer in a particle shape on the buffer layer;

etching the buffer layer exposed through the catalyst layer; and growing Carbon Nanolubes (CNTs) from the catalyst layer formed on the etched buffer layer.

13. The method of claim 12, wherein the buffer layer is formed of a material having an etch selectivity with respect to the catalyst layer.

14. The method of claim 13, wherein the buffer layer is formed of at least one metal selected from a group consisting of Al, B, Ga, In, Tl, Ti, Mo, and Cr.

15. The method of claim 13, wherein the buffer layer is formed to a thickness in a range of 10 to 3000 Å.

16. The method of claim 13, wherein the catalyst layer is formed of at least one metal selected from a group consisting of Fe, Co, and Ni.

17. The method of claim 13, wherein the catalyst layer is formed to a thickness in a range of 2 to 100 Å.

18. The method of claim 12, wherein the cathode electrode is formed of at least one metal selected from a group consisting of Mo and Cr.

19. The method of claim 12, wherein forming the emitter hole comprises:

forming a photoresist on the patterned gate electrode; and etching the insulating layer exposed through the photoresist and the gate electrode until the cathode electrode is exposed.

20. The method of claim 19, wherein forming the buffer layer and the catalyst layer comprises:

forming the buffer layer on the photoresist and the cathode electrode in the emitter hole; and forming the particle shaped catalyst layer on the buffer layer.

21. The method of claim 20, further comprising removing the photoresist and the buffer layer and catalyst layer formed on the photoresist after the buffer layer exposed through the catalyst layer has been etched.

22. The method of claim 12, wherein the etching of the buffer layer is continued until the cathode electrode is exposed.

23. The method of claim 12, wherein the CNTs are grown using a Chemical Vapor Deposition (CVD) method.

24. The method of claim 12, further comprising forming a resistance layer on either an upper or a lower surface of the cathode electrode.

25. The method of claim 24, wherein the resistance layer is formed of amorphous silicon.

* * * * *